United States Patent
Ahmed et al.

(10) Patent No.: US 9,934,923 B2
(45) Date of Patent: Apr. 3, 2018

(54) RELAY WITH INTEGRAL PHASE CONTROLLED SWITCHING

(71) Applicant: TYCO ELECTRONICS CORPORATION, Berwyn, PA (US)

(72) Inventors: Mohammad Siddique Ahmed, Mechanicsburg, PA (US); Raymond Howard Kohler, Souderton, PA (US); Ganesh Bhatt, Dallastown, PA (US); Alexander King, Lancaster, PA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 675 days.

(21) Appl. No.: 14/563,452

(22) Filed: Dec. 8, 2014

(65) Prior Publication Data

US 2015/0170860 A1 Jun. 18, 2015

Related U.S. Application Data (60) Provisional application No. 61/915,848, filed on Dec. 13, 2013.

(51) Int. Cl.
*H01H 47/00* (2006.01)
*H01H 9/56* (2006.01)
(Continued)

(52) U.S. Cl.
CPC ........... *H01H 47/001* (2013.01); *H01H 9/54* (2013.01); *H01H 9/56* (2013.01); *H01H 47/22* (2013.01);
(Continued)

(58) Field of Classification Search
CPC ........ H01H 47/001; H01H 47/04; H01H 9/54; H01H 9/56; H01H 47/22–47/223; H02H 3/021; H02H 3/08–3/085
(Continued)

(56) References Cited

U.S. PATENT DOCUMENTS 7,262,950 B2 * 8/2007 Suzuki ................... H01H 47/04
361/139
2003/0071522 A1 4/2003 Baranowski et al.
(Continued)

FOREIGN PATENT DOCUMENTS

CN 101908439 A 12/2010
CN 103 389 407 A 11/2013
(Continued)

OTHER PUBLICATIONS

Annex to Form PCT/ISA/206, Communications Relating to the Results of the Partial International Search, International Application No. PCT/US2014/069437, International Filing Date, Dec. 10, 2014.

*Primary Examiner* — Jared Fureman
*Assistant Examiner* — Christopher Clark (57) ABSTRACT

A relay circuit includes a power supply to apply an AC input line voltage to the relay circuit, a relay coil and at least one pair of contacts actuated by the relay coil. A zero cross detection circuit and a control logic circuit for the relay circuit are also disclosed. The control logic circuit determines a zero crossover point in response to an output signal from the zero crossover detection circuit, and controls a relay coil to actuate the relay contacts to switch a load at the zero crossover point of a load current when the load is connected to the at least one pair of relay contacts, such that the voltage and current across the relay contacts is zero.

13 Claims, 10 Drawing Sheets

(51) Int. Cl.
    *H02H 3/02*     (2006.01)
    *H01H 47/22*    (2006.01)
    *H01H 51/01*    (2006.01)
    *H02H 3/08*     (2006.01)
    *H02H 9/00*     (2006.01)
    *H01H 9/54*     (2006.01)
    *H03K 17/18*    (2006.01)

(52) U.S. Cl.
    CPC ............ *H01H 51/01* (2013.01); *H02H 3/085* (2013.01); *H02H 9/001* (2013.01); *H03K 17/18* (2013.01); *H01H 2009/566* (2013.01); *H02H 3/021* (2013.01)

(58) Field of Classification Search
    USPC ........................................................ 361/154
    See application file for complete search history.

(56) References Cited

U.S. PATENT DOCUMENTS

| | | | |
|---|---|---|---|
| 2013/0342950 A1* | 12/2013 | Westrick, Jr. .......... | H01H 47/22 361/170 |
| 2014/0028354 A1* | 1/2014 | Yao ...................... | G01R 19/175 327/79 |
| 2014/0118875 A1* | 5/2014 | Carlino .................. | H01H 71/74 361/93.2 |
| 2014/0268474 A1 | 9/2014 | Steiner et al. | |
| 2015/0170860 A1 | 6/2015 | Ahmed et al. | |

FOREIGN PATENT DOCUMENTS

| | | |
|---|---|---|
| DE | 44 12 640 A1 | 10/1995 |
| EP | 2 584 581 A1 | 4/2013 |
| EP | 2 858 193 A1 | 4/2015 |
| WO | 90 / 10942 A1 | 9/1990 |

* cited by examiner

RELAY WITH INTEGRAL PHASE CONTROLLED SWITCHING

CROSS-REFERENCE TO RELATED APPLICATION

This application claims priority to and the benefit of U.S. Provisional Application No. 61/915,848 filed Dec. 13, 2013, entitled "SMART RELAY WITH INTEGRAL PHASE CONTROLLED SWITCHING", which is hereby incorporated by reference in its entirety.

BACKGROUND

The application generally relates to an electrical relay. The application relates more specifically to a relay with integral phase controlled switching for reduced surge current adaptable to changing conditions and different relays to optimize and/or reduce manufacturing cost.

AC powered capacitance and inductive loads may be difficult to control with a conventional relay. If the relay contacts are closed at the peak voltage of the power line a large inrush current may be created as the capacitive load charges to the peak voltage. The only factors for limiting the inrush current are provided by parasitic inductance and resistance in the load.

Integral phase controlled switching of the relay contacts, as disclosed below, ensures that the relay contacts only close at the zero-crossover point of the input voltage, i.e., when the voltage across the relay contacts is substantially zero. The sinusoidal waveform of the voltage limits the rate of rise in the current on the capacitive load.

In addition, some inductive loads such as transformers are designed so the current drives the flux density of the core close to saturation. The steady state flux is driven positive and negative alternately. During start up the flux in the core is zero and if the contacts are closed coincident with the zero crossing, flux increases for a full half cycle of the line voltage. This drives flux much higher than the steady state and exceeds the core saturation. Once the transformer core is saturated the inductance rapidly decreases and the current is only limited, e.g., by resistance of connecting wires and the transformer primary winding resistance. For transformers in the 1000 VA range the current can exceed 100 amperes. If the relay contacts close at peak line voltage, the core flux has only ¼ cycle to build up magnetic flux. The voltage polarity then reverses and the flux density of the full sine wave half-cycle does not reach peak value. The flux density fails to reach peak value because the transformer core has an opposing value built up from the previous ¼ cycle, i.e., the input voltage is not initially zero. When this occurs core saturation and high currents are prevented.

Traditional electrical relays have many difficulties in obtaining reliable operation over an extended operational life. If the connected load is not compatible with the relay, the relay contacts may be degraded by due to burning and sticking contacts, caused by arcing when the relay contacts are switched with current flowing between them.

Many applications require that the right range of voltage and current drive be available, placing additional requirements on the system design.

For a large system with many relays involved there are many wires and drivers required in the design of the system.

Excessive overload currents can lead to overheating and failure of the relays.

Other problems present in existing electrical relays include high current drive. Also, overheating of the relay can occur from failure of the relay contacts due to burning and sticking.

Therefore, to achieve greater relay life, it is desirable to reduce or eliminate arcing and inrush current upon the opening or closing of the relay contacts. One method of reducing or eliminating arcing upon the opening or closing of the relay contacts is to control the operation of the relay to open or close at a zero current point in the AC load circuit to eliminate arcing at the relay contacts.

Other features and advantages will be made apparent from the present specification. The teachings disclosed extend to those embodiments that fall within the scope of the claims, regardless of whether they accomplish one or more of the aforementioned needs.

SUMMARY

In one embodiment a relay circuit for an electromagnetic relay assembly including a relay coil and at least one pair of contacts actuated by the relay coil, includes a power supply to apply an AC input line voltage to the relay circuit, a zero cross detection circuit; and a control logic circuit. The control logic circuit adaptively determines a zero cross point in response to an output signal from the zero cross detection circuit. The control logic circuit controls the relay coil to actuate the relay contacts to switch a load at the zero cross point of a load current when the load is connected to the at least one pair of relay contacts, such that the voltage and current across the relay contacts is zero.

In another embodiment a control logic circuit for a relay is disclosed, which includes a microcontroller. The microcontroller is programmable to determine a zero crossover point in response to an output signal from the zero crossover detection circuit; and to control a relay coil to actuate the relay contacts to switch a load at the zero crossover point of a load current when the load is connected to the at least one pair of relay contacts, such that the voltage and current across the relay contacts is zero.

Yet another embodiment relates to an electromechanical relay that includes an adaptive zero cross detection circuit in communication with a control logic circuit. A power supply is provided for driving the control logic circuit, a current scaling and offset circuit, a relay coil and at least one pair of relay contacts controllable by the relay coil. The control logic circuit includes an A-D converter for inputting a control signal to the control logic circuit, and a close-and-hold drive circuit for operating the relay coil. A reference voltage is provided by the power supply to the current scaling and offset circuit. The current scaling and offset circuit is arranged to drive the A/D converter. The relay contacts associated with the relay coil are controllable to switch a load such that voltage and current is zero across the relay contacts when switched.

Certain advantages of the embodiments described herein include a relay having integral phase controlled switching for reduced surge current and longer life.

The disclosed relay includes an integral self adjusting feature that allows the relay to adapt to changing conditions and different relays to optimize/reduce manufacturing costs. The relay further discloses advantages such as a digitally isolated serial/wireless communication scheme, temperature sensing for over current protection, and current and temperature thresholds that may be set dynamically for shutting off the relay if the current exceeds a threshold. Additionally the relay may be controlled for its ON/OFF functionality via a communication scheme. Internal relay diagnostics can report various problems or indication of relay failure over the communications scheme, for example, an open relay coil, or no load current when the relay contacts are closed.

By providing current monitoring and zero-crossover detection features, the relay contacts can be controlled to open at zero crossing point of the current waveform. Inductive loads with zero current have no stored energy and cannot generate inductive kick-back voltage or arcing contacts. By reducing arcing of the relay contacts experience less erosion and EMI (Electromagnet Magnetic Interference).

Phase controlled switching may be automatically configured. I.e., the system can evaluate the load and adjust the timing of the contact closure with respect to the ac power line zero crossing for optimum performance.

DC relay coils which are less expensive may be used for relay coil 22 instead of AC relay coils, thus avoiding the need to include shading rings to prevent buzzing or contact chatter during the zero crossing.

The disclosed invention further provides a mechanism to have adaptive control for the reaction time for the relay for AC applications such that the relay switches at the zero-crossing point. Relay switching time may vary from the beginning of a relay's life to the end of its life, due to deterioration and wear in the coil, contacts and other relay components, and the adaptive zero cross detection feature accommodates for the variable switching time.

Alternative exemplary embodiments relate to other features and combinations of features as may be generally recited in the claims.

DETAILED DESCRIPTION OF THE EXEMPLARY EMBODIMENTS

Figure 1:
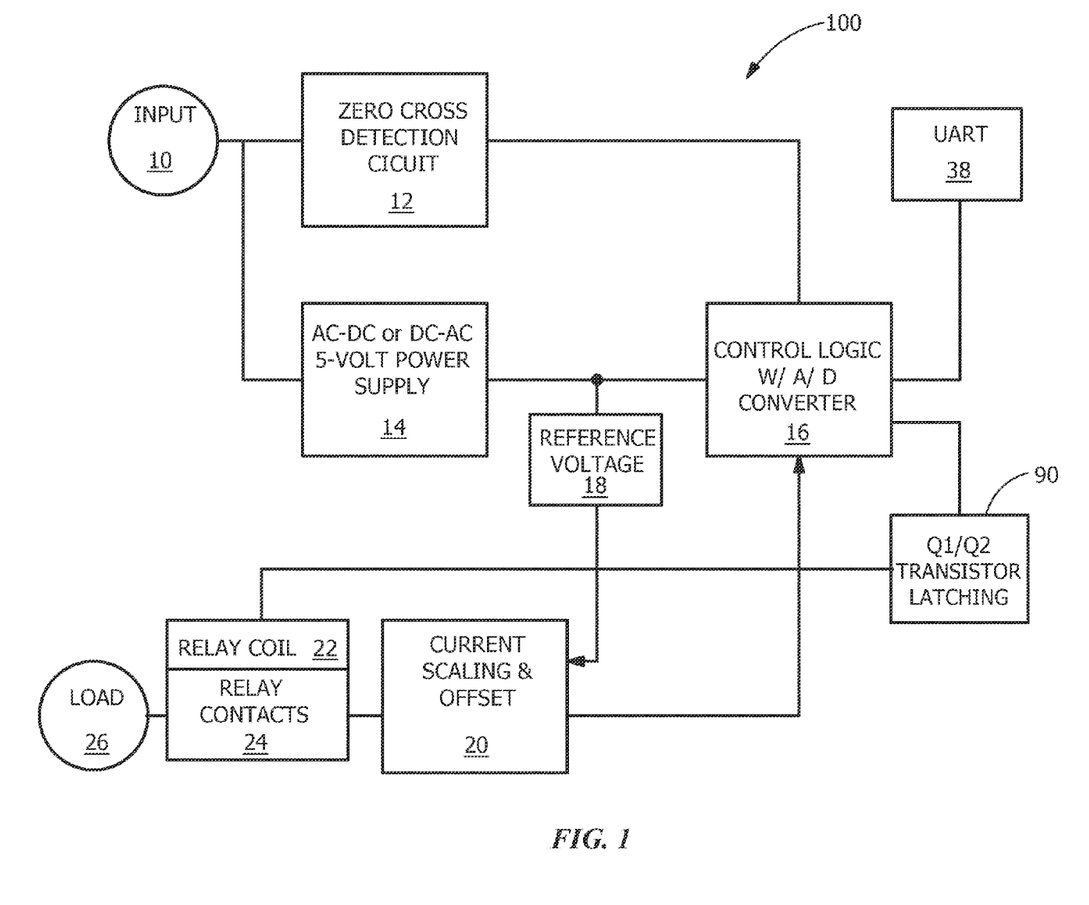
FIG. 1 is a block diagram for an exemplary relay circuit.
Figure 7:
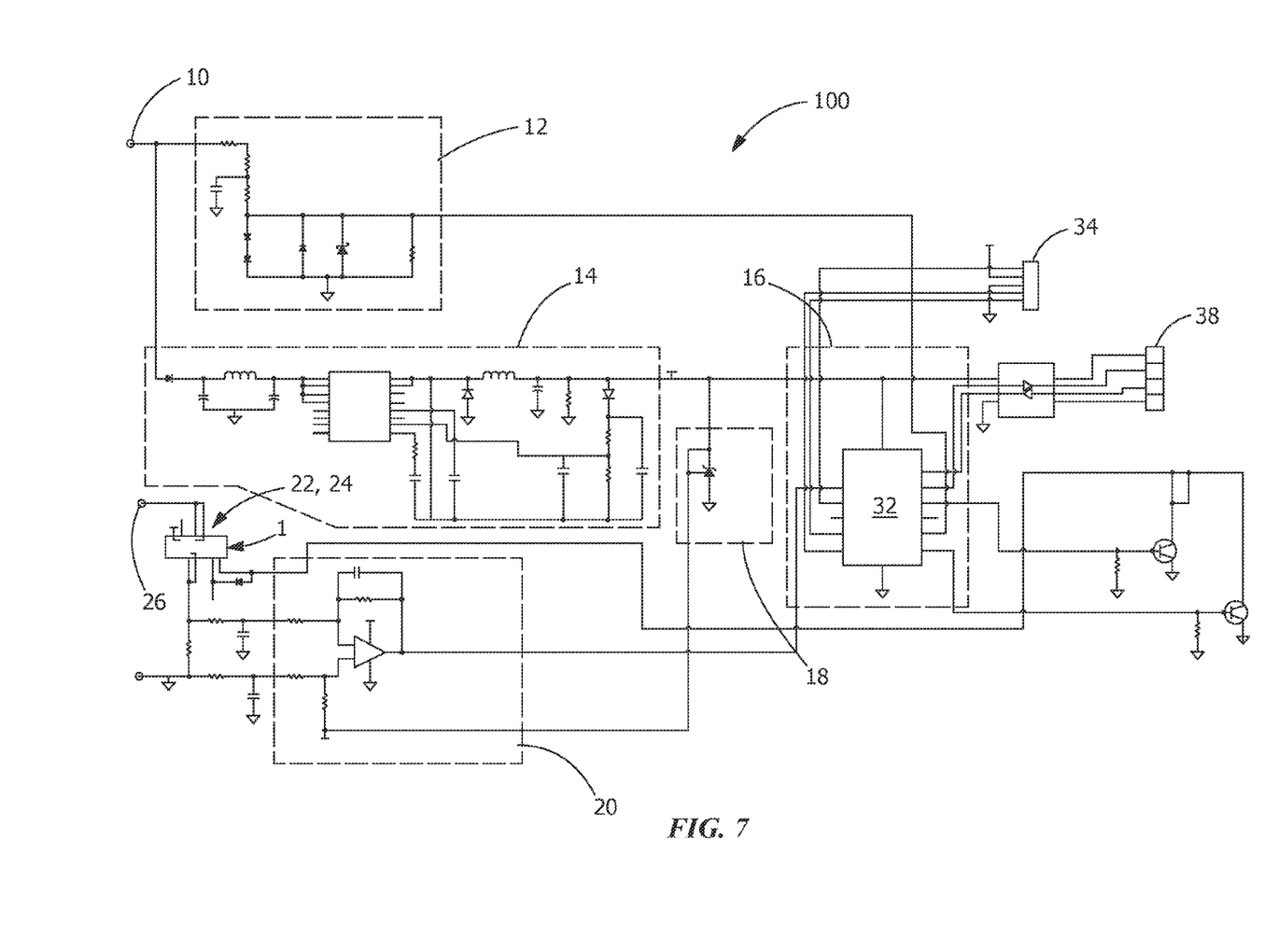
FIG. 7 is a complete schematic diagram of the exemplary relay of FIGS. 1 through 6.

Referring to FIG. 1, a block diagram for a relay circuit 100 is shown. An AC input line voltage 10 is applied to circuit 100 at an input to a zero cross detection circuit 12, and power supply 14. Zero crossover detection circuit 12 provides an output signal to a control logic circuit 16 for determining the precise point of zero crossover of the switched load, as described in further detail below. Power supply 14 provides power 5-volt DC power to control logic circuit 16, and a reference voltage 18 for current scaling and offset circuit 20. Control logic circuit 16 controls operation of a relay coil 22, to actuate relay contacts 24 to switch a load 26 at a zero cross point of the load current. FIG. 7 is the complete schematic diagram of the exemplary relay of FIGS. 1 through 6.

Figure 2:
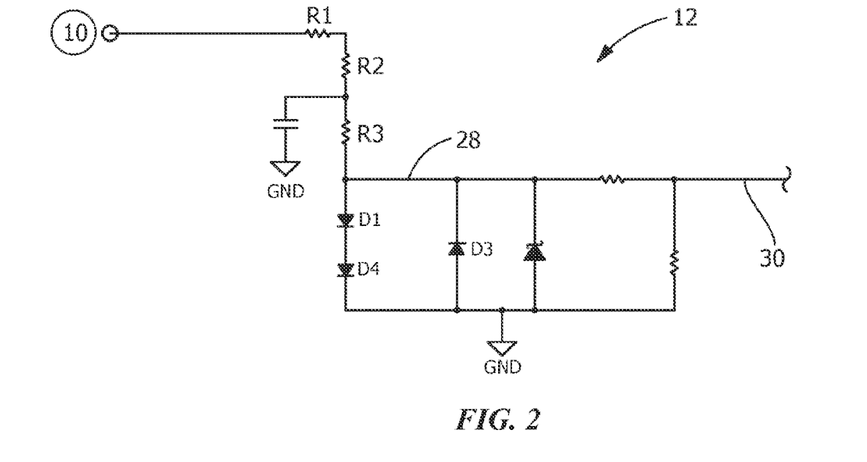
FIG. 2 is a circuit schematic diagram of an exemplary zero cross detection circuit.
Figure 3:
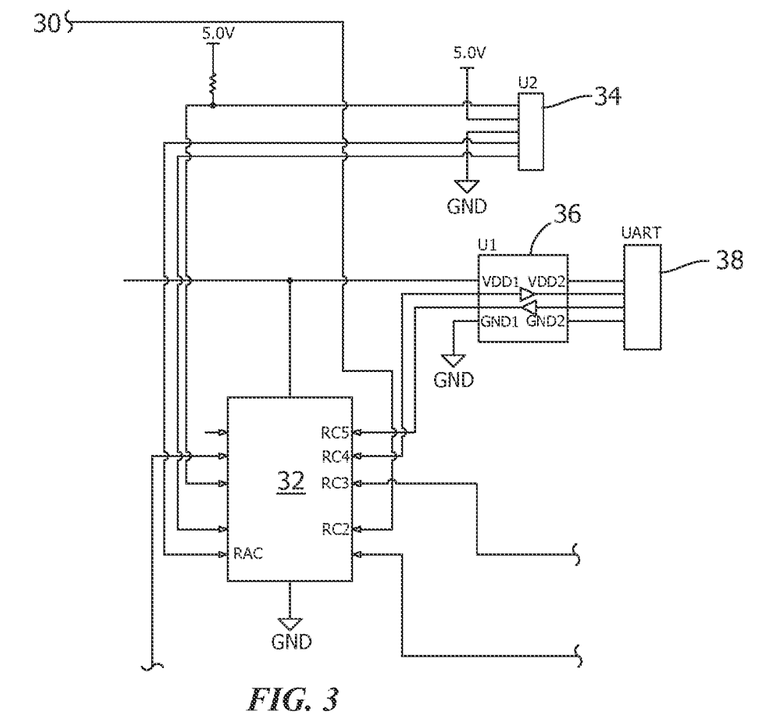
FIG. 3 is a circuit schematic diagram of the control logic with A-D converter.
Figure 9:
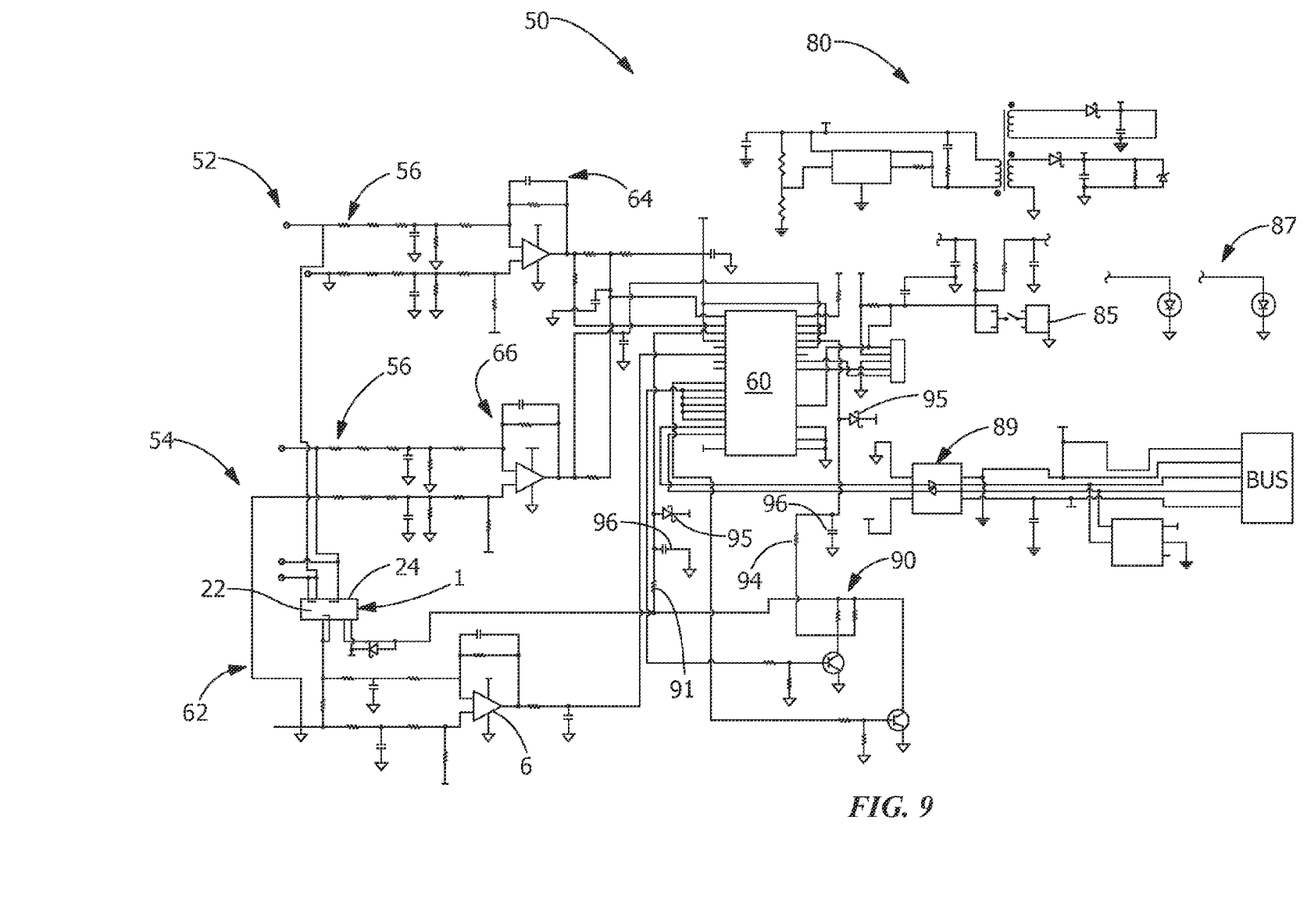
FIG. 9 shows a schematic diagram of an alternate embodiment of a relay circuit.

Referring next to FIG. 2, a circuit schematic of an exemplary zero cross detection circuit is shown. Input signal 10 is applied to resistors R1, R2 and R3 connected in series with a diode arrangement 28. Input voltage may range, e.g., from 120 volts to 277 volts, although higher or lower voltages may also be used with the disclosed circuit using appropriately rated components. A capacitor C1 is connected in parallel with the input voltage and the diode arrangement 28 between R2 and R3 to drain high frequency noise from input voltage 10. Diode arrangement 28 includes a pair of series connected diodes D1, D4 connected in reverse parallel with diode D3, and a zener diode D2 rated for 12 volts connected in parallel with diode D3. An output resistor R4 is connected between D2 and resistor R5 at the output of circuit 12, with the zero cross output signal 30 connected between R4 and R5. Diode arrangement 28 functions as a voltage clamping circuit to limit the input signal voltage for input to microcontroller 32 (FIG. 3). Alternate arrangements may be used for diode arrangement 28, including eliminating diodes D1, D4, or eliminating the Zener diode. In addition, the circuit shown in FIG. 9 shows an alternate embodiment eliminating a diode arrangement 28, by applying the voltage output of amplifiers in circuits 64, 66 directly to the inputs of microcontroller 60.

Referring next to FIG. 3, signal 30 is communicated to microcontroller 32. Microcontroller 32 may be an integrated circuit (IC), In one exemplary embodiment the IC may be a QFN-type package with 12 input/output (I/O) terminals, 2K flash memory and 128 of RAM. Microcontroller 32 is programmable through a program port 34 in data communication with microcontroller 32. Microcontroller 32 is also connected to a dual channel digital isolator 36 interfacing with a Universal Asynchronous Receiver/Transmitter (UART) 38. Universal Asynchronous Receiver/Transmitter (UART) 38 provides serial communications over a computer or peripheral device serial port (not shown), e.g., Rs-232 or similar data format. Alternatively, other serial or wireless communications formats may be employed. The digitally isolated serial/wireless communication scheme enables the system to provide information in and receive information out of relay 100 for various parameters associated with relay 100, e.g., temperature, current, voltage etc. Current and temperature thresholds may be set dynamically and stored in the relay for safety, including after the power cycle. Relay 100 can be controlled for its ON/OFF functionality via communication scheme.

Microcontroller 32 controls relay coil 22 portion of electromechanical relay assembly 1 (FIG. 6) via transistor circuit Q1, Q2.

Figure 4:
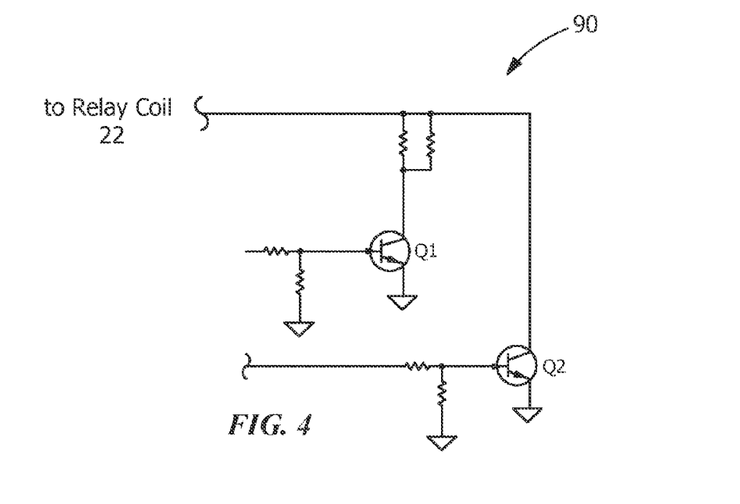
FIG. 4 is a schematic diagram of a relay dual drive.

Referring next to FIG. 4 a dual drive close and hold current is shown. Full power is provided to close the relay and then reduced drive current is used to hold the contacts closed. Transistor Q2 is configured to actuate relay coil 22 at full power, and transistor Q1 is configured to maintain relay coil 22 in the actuated state until microcontroller 32 signals to de-actuate relay 1. Microcontroller 32 includes an A-D converter to digitize the zero cross signal input for processing.

Figure 5:
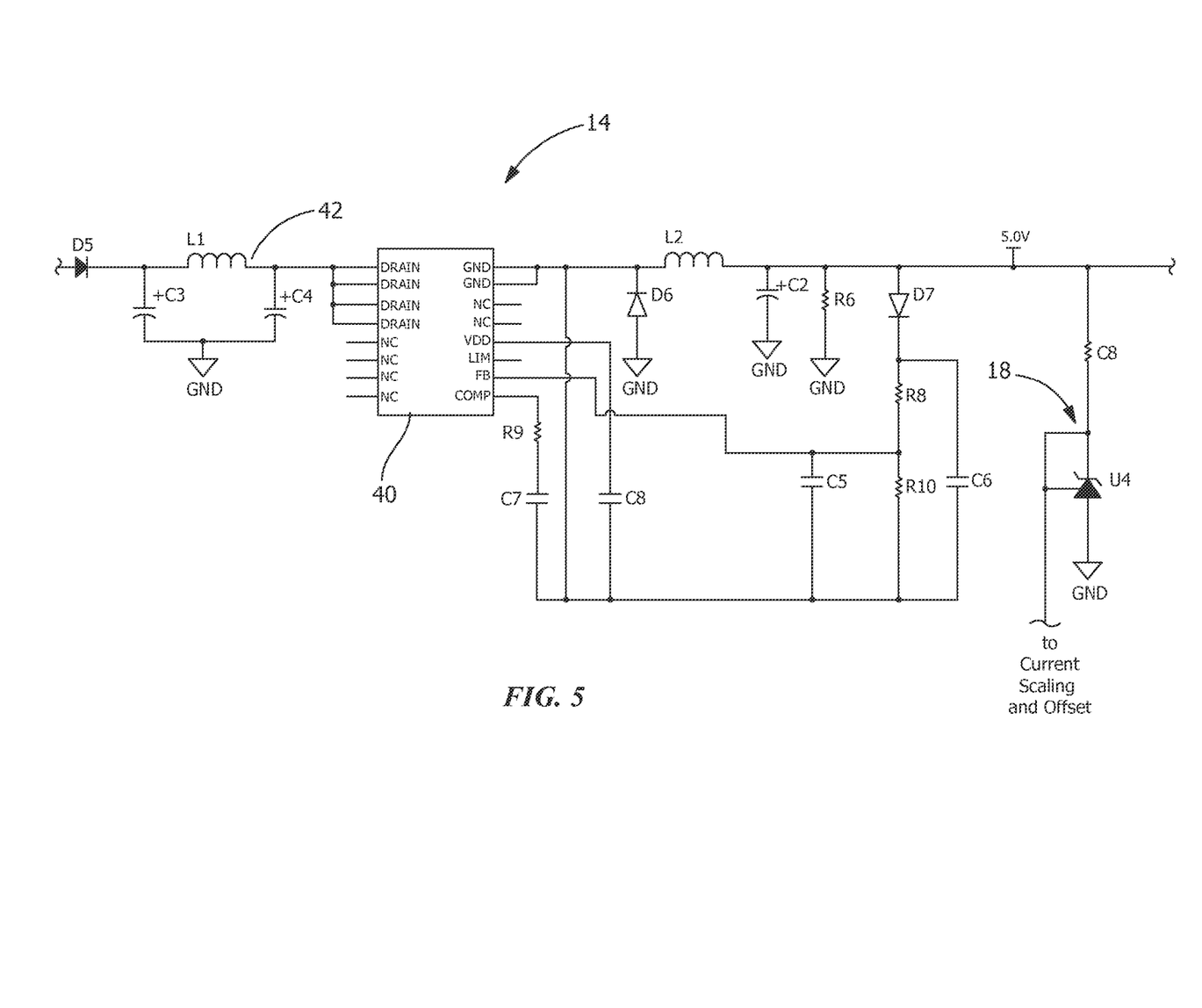
FIG. 5 is AC-DC or DC-DC 5 volt power supply for powering the relay.

Referring next to FIG. 5, a DC-DC 5 volt power supply 14 is shown. Power supply 14 may include a DC-DC 5-volt power supply IC 40. Power supply 14 includes a diode D5 at the input to convert the AC input sinewave to a rectified half-wave for input to L-C circuit 42, with capacitors C3, C4 in parallel with inductor L1. The output of circuit 42 is connected to drain inputs of IC 40. IC 40 provide 5 volt output to power IC 32, and reference voltage 18 for scaling and offset for circuit 20. In another embodiment power supply 14 may be an AC-DC 5 volt power supply.

Figure 6:
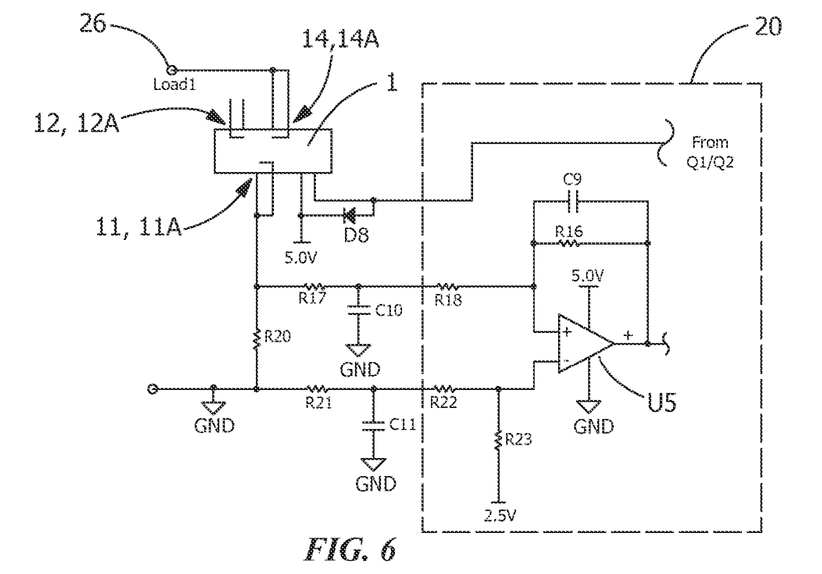
FIG. 6 shows a relay portion and current scaling and offset circuit.

Referring next to FIG. 6, current scaling and offset circuit 20 and zero-cross electromechanical relay assembly 1 are shown. A relay coil actuation signal is received from transistor circuit Q1, Q2 (FIG. 4). Electromechanical relay assembly 1 may have multiple sets of contacts, which may be configured as normally open (NO) contacts or normally closed (NC) contacts, depending on the application. In the exemplary embodiment shown in FIG. 6, two sets of NO contacts 12, 12A and 14, 14A are shown. When electromechanical relay assembly 1 is actuated, contacts are operable to switch power to load 26. Contacts 11, 11A are connected to current scaling and offset circuit 20. Circuit 20 includes a differential amplifier IC U5. U5 is connected to microcontroller 32, which is programmed to switch electro-mechanical relay contacts when the load current is zero.

An integral diode clamp may be provided for EMI reduction.

Current sensing may be provided in relay 100 for over current protection. Over current protection can be provided in the form of shutting off the relay if the current exceeds a threshold. Also, temperature sensing may be provided for overcurrent protection. Thermal protection may also be provided in the form of shutting off the relay if the temperature exceeds a threshold.

Relay 100 has a low drive current. The design is simplified as the relay drive is built-in and only variable low current voltage control is needed. Voltage thresholds may be programmed dynamically through a program port 34 (FIG. 3) to accommodate different applications.

Figure 8:
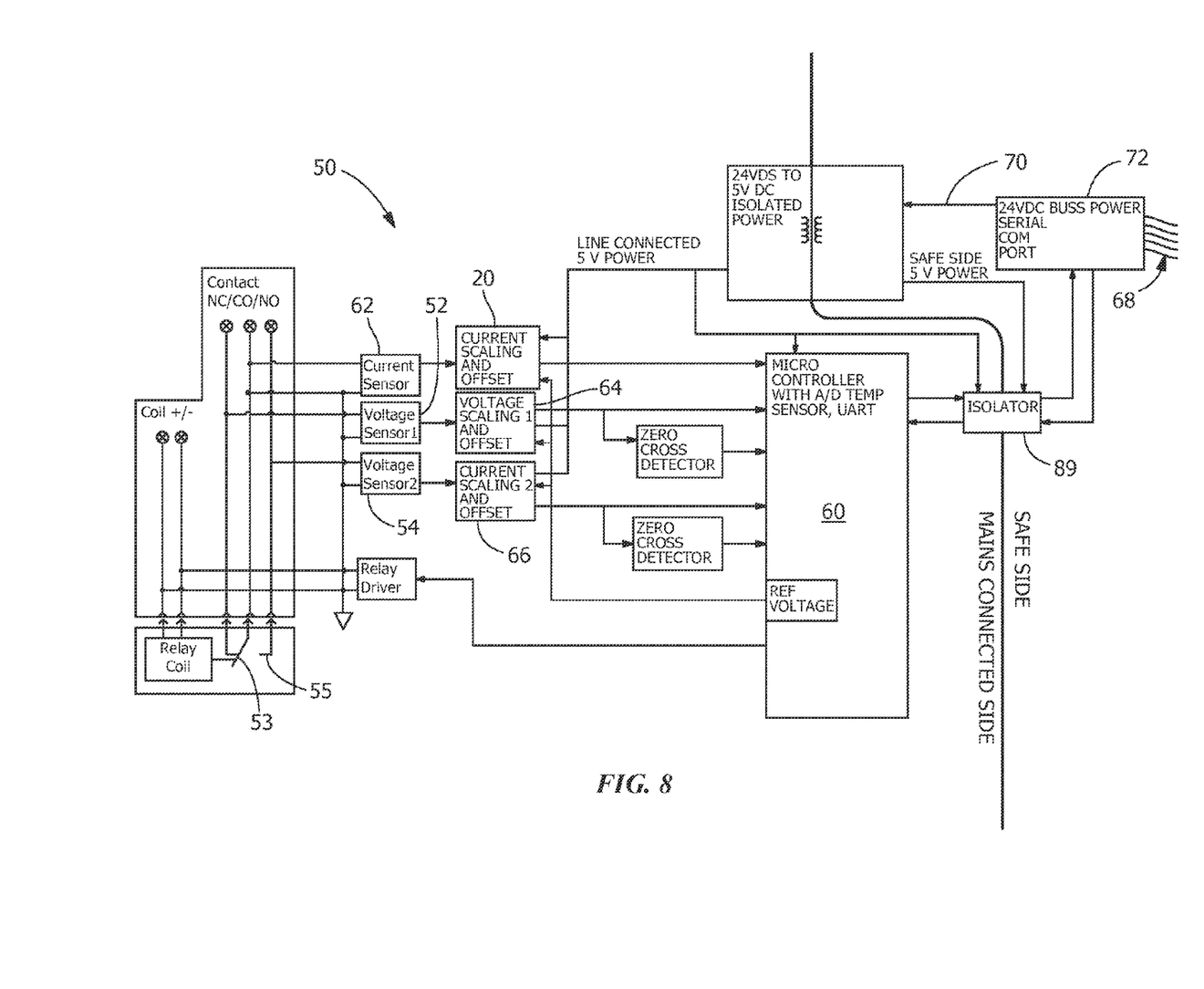
FIG. 8 shows an alternate embodiment of a relay circuit.
Figure 10:
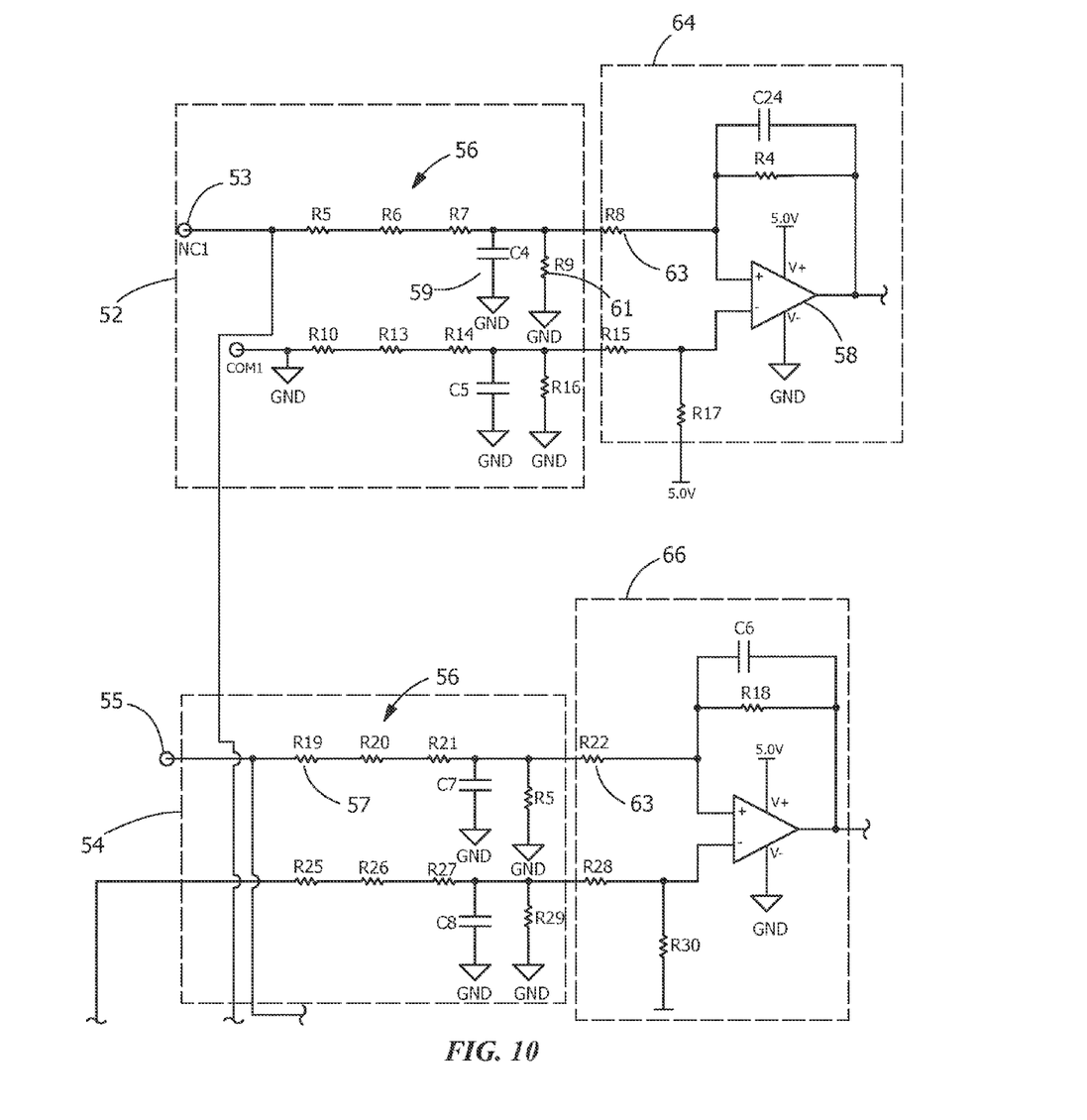
FIG. 10 shows an exemplary voltage sensor circuit for the relay circuit of FIG. 9.

In another embodiment, a relay circuit 50 may be implemented according to the system diagram shown in FIG. 8. The relay circuit 50 may provide operational feedback on the connected load to the host controller, including power consumption (current and voltage sensing) and overload monitoring. Operational feedback information is gathered in a way that is transparent to the load, while maintaining an effective level of resolution. A pair of voltage sensors 52, 54 are connected across normally closed contact 53 and normally open contact 55, respectively. An input terminal to the voltage sensor 52, 54 is directly connected to terminal contacts 53, 55, respectively. The sensed voltage is attenuated by a resistor divider circuit 56 to reduce the input signal voltage to a level suitable for input to an operational amplifier, or op amp, 58 (FIG. 10). In one embodiment op amp 58 may be a low offset chopper-stabilized differential op amp. Op amp 58 provides an analog signal in a usable voltage range to a microcontroller (MCU) 60. MCU 60 includes an onboard or integral analog-to-digital converter (ADC), and reads the op amp output signal via the ADC to determine the magnitude of the input voltage.

FIG. 9 shows a complete schematic diagram of an exemplary relay circuit 50, including voltage sensors 52, 54. Referring also to FIG. 10, a resistor divider circuit 56 in each voltage sensor 52, 54 includes three resistors 57 connected in series having equal resistance value, e.g., 20 MΩ each. The resistors 57 are connected in parallel with a capacitor 59 and a resistor 61 that are connected to ground terminals at the opposite end. The output of voltage sensors 52, 54, respectively, is connected through a series resistor 63 to a voltage scaling and offset circuit 64, 66, respectively, and then fed into MCU 60 for processing. Current scaling and offset circuit 62 is configures substantially as described above with respect to FIG. 6, and includes a differential amplifier IC 6 connected to MCU 60, which is programmed to switch contacts 53, 55 when the load current is zero.

Figure 11:
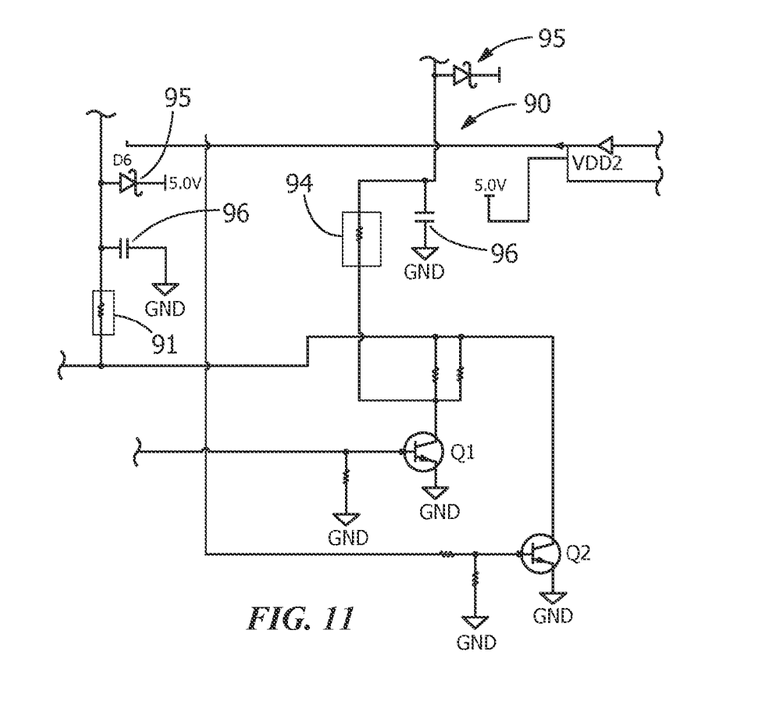
FIG. 11 shows an exemplary relay drive circuit for measuring relay coil resistance.

FIG. 11 shows an exemplary relay drive circuit 90 for measuring relay coil resistance. Relay coil resistivity can be determined by MCU 60 ADC using predetermined temperature-stabilized resistor values. Coil resistivity must be measured while relay coil 22 is energized. Relay coil voltage is supplied to ADC multiplexer on MCU 60 through 100Ω resistor 91 and the voltage across parallel combination of resistors 92, 93 is fed through 100Ω resistor 94. Resistors 92, 93 may have resistance value of 52.3Ω in one embodiment. The resistance value is selected to set the desired value of the reduced relay drive current. The voltage across resistors 92, 93 is proportional to the coil current when the relay is energized. Diodes 95 and capacitors 96 provide filtering and transient protection. Note that values for resistors and capacitors are provided for example only and their values may be varied, e.g., to accommodate different components and related characteristics to achieve the same or similar results. A relay coil actuation signal is received from transistor circuit Q1, Q2. The dual-stage coil drive circuit 90 energizes the coil at full power initially to close the relay contact quickly and predictably. Drive circuit 90 then reduces coil current to a hold state to maintain contact closure while limiting power dissipation by relay coil 22. The reduced coil current reduces power consumption by the relay and limits internal resistance heating of the relay elements.

Referring again to FIG. 9, additional switches 85 and LEDs 87 may be provided, e.g., to provide alarm conditions to indicate a parameter associated with the relay or relay circuit 50 that may be outside of pre-set tolerance values. Also, electrical isolation may be provided by an isolator 89.

Current sensing circuit 62 (FIG. 9) senses the current through relay coil 22. Circuit 62 implements a similar differential op-amp topology as that shown in FIG. 6, with the addition of a shunt resistor with 0.001Ω resistance. With a continuous 16 amp current, the shunt resistor dissipates 0.25 watts and develops +/−22.6 mV peak at the amplifier. This signal is then scaled by op amp 6 for use by MCU 60 by the integral ADC.

Figure 12:
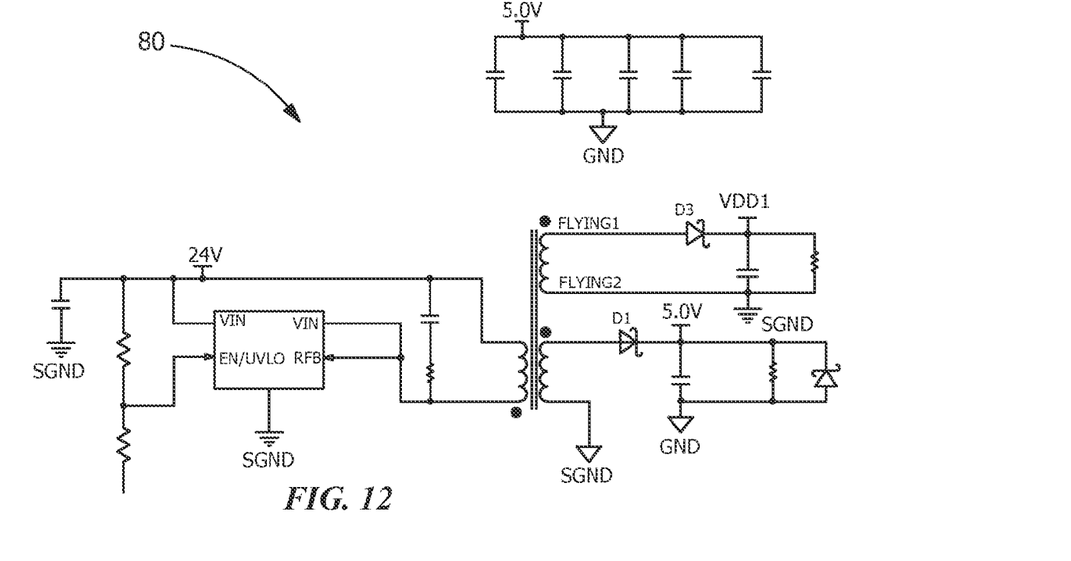
FIG. 12 shows an exemplary power supply circuit for the relay circuit of FIG. 9.

FIG. 12 shows an exemplary power supply 80 for providing a 5 volt (DC) source for circuit 50. An AC input voltage, e.g., 24 volts, is converted to 5 VDC with isolation between the AC input voltage and the DC output.

MCU 60 is programmed to communicate voltage and current readings associated with electromechanical relay assembly 1 to the host controller. MCU 60 also continuously checks against pre-set operational thresholds. If a pre-set threshold is exceeded, the relay 50 may enter into an error mode configurable by the user. Error responses may include generating warnings or alarms, or turning the relay off immediately as a fail-safe mechanism. These user-defined parameters may be stored locally on the relay in non-volatile memory, and persist regardless of power ON/OFF cycles until changed by the user. For example a relay rating for 16 amps may have a threshold set below 16 amps by a desired safety factor, e.g., 20% of rated full load amperage. In another example, where the load current maximum is 5 amps, the threshold current threshold may be set for 6 amps to indicate that there may be a fault in the system.

Relay 50 is further programmable to monitor and report characteristics of electro-mechanical relay 1, e.g., operating cycles, relay coil resistance, internal temperature, ambient temperature, and environmental history. Both current information and historical data associated with relay 50 may be stored to provide data related to the health, or condition, of the relay. For example, a measurement of relay coil resistance indicates whether relay coil 22 has suffered any short-circuited windings or broken wires. A resistance value that is out of specified tolerances for coil resistance may indicate that the relay coil 22 is nearing the end of its operational life. By counting the cumulative operating cycles of the relay, one may make an informed determination to replace the electromechanical assembly portion of the relay that may be approaching failure. A programmable lifetime cycle limit can indicate that it may be time to replace a relay.

Relay 50 records the cumulative time that electromechanical relay assembly 1 is energized, i.e. in the "on" state, which may indicate contact fatigue and provide data on performance of the relay load. Ambient temperature measurements may be useful to record conditions on the interior of a relay cabinet or installation to indicate whether the relay environment is within prescribed specifications. Internal relay temperature may disclose operational conditions that accelerate relay fatigue. Relay heat rise is a function of excessive current through the relay contacts, ambient temperature, and coil resistive heat. Relay 50 may also record data such as peak operating temperature and peak current over the life of the relay. This provides an indication of the conditions to which the relay was exposed so that exposure to over-temperature or excessive load may be readily identified.

The resistance of relay coil 22 may be measured using existing relay drive circuitry. By using the MCU 60 ADC and temperature-stabilized resistor values, coil resistivity may be determined. A relay coil resistance measurement must be collected while relay coil 22 is energized and the relay is "ON".

Figure 13:
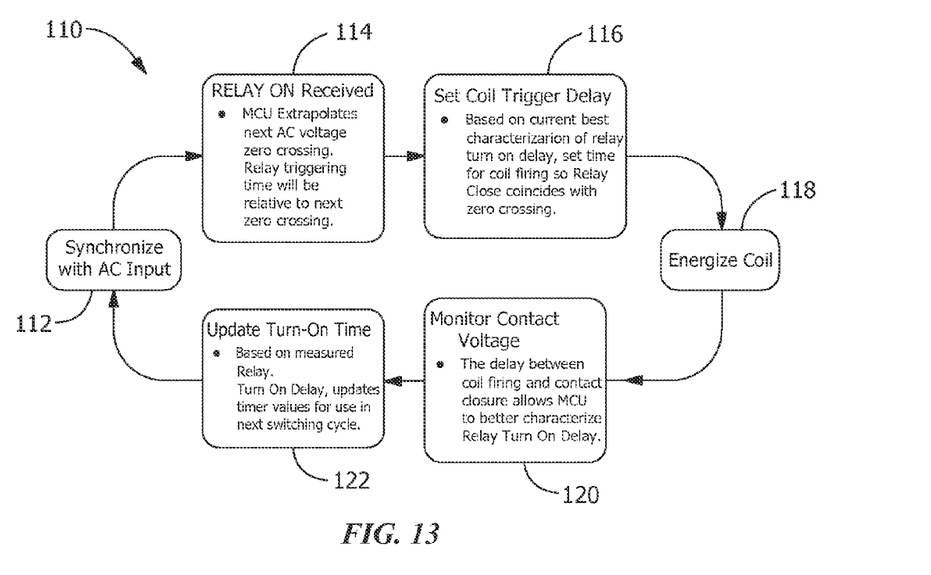
FIG. 13 shows an exemplary adaptive algorithm for determining turn-on delay for zero-cross switching.

Referring next to FIG. 13, an adaptive algorithm 110 for determining turn-on delay for zero-cross switching is shown. Algorithm 110 is implemented in MCU 60, e.g., through firmware installed on MCU 60. At step 112, MCU 60 synchronizes with AC input voltage values output from voltage scaling and offset circuits 64, 66. Next, at step 114 a relay "on" indication is received by MCU 60. At step 114 MCU extrapolates the next zero crossing of the AC input voltage, and adjusts the relay trigger time relative to the next zero crossing. The system then proceeds to step 116, and sets a delay interval for triggering relay coil 22. Based on the current characteristics of the relay, MCU 60 sets the time for triggering the coil so that the timing of the relay contact closing coincides with the zero crossing. Next, at step 118, MCU 60 energizes relay coil 22. After energizing relay coil 22 the system proceeds to step 120 to monitor the contact voltage. The delay between the trigger signal generated to relay coil 22 and closure of the relay contact is determined, and at step 122 the delay in the turn on time is updated to MCU 60 memory and used in the next switching cycle. Then the system returns to step 112 to synchronize with the AC input voltage and the algorithm is repeated.

A communication and power bus architecture may be provided on the relay circuit 50 to allow data transfer of the load monitoring and relay diagnostic information to a host controller (not shown) for storage. In one embodiment the relay circuit 50 may include a 5-wire bus 68 having Ground (GND), Transmit (TX), and Receive (RX) transmission lines. A +24 VDC line 70 powers the Smart Socket onboard circuitry including the relay coil drive, ensuring operation independent of load connection. The transmission and 24V power conductors may be embedded in a DIN rail, to provide a snap-in connection of a DIN-mountable relay circuit 50.

Figure 14:
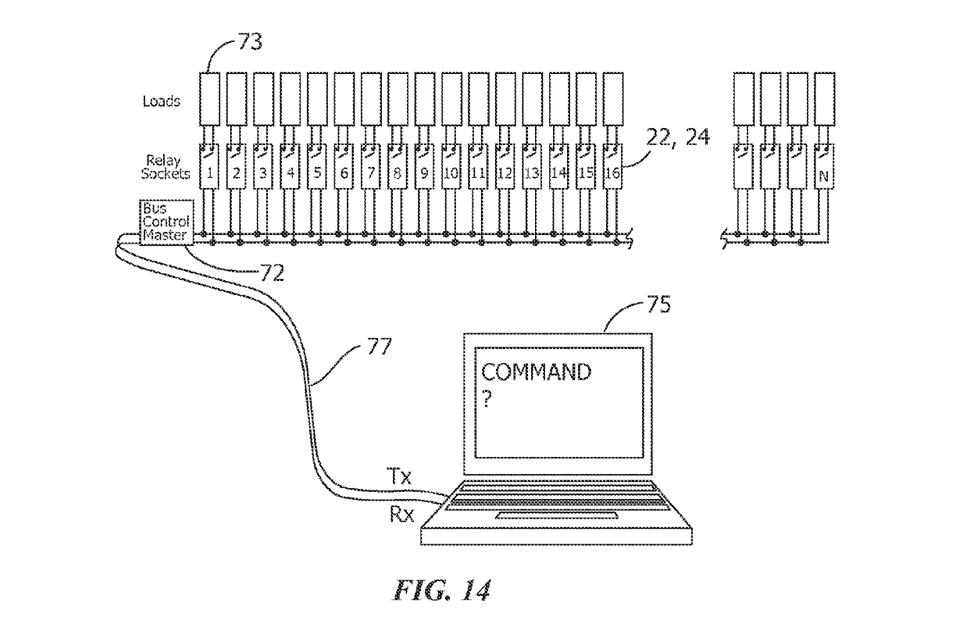
FIG. 14 shows a data communications diagram with a data bus control module deployed in association with the relay circuit of FIGS. 7 and 9.

Referring next to FIG. 14, a bus control master module 72 may be deployed in association with the relay circuit 50 to perform serial communication level shifting, protect the host PC from transmission line transients, and provide +24 VDC bus power to the relay circuits 50. Relay loads 73 are shown connected to the relay contacts 24. In one embodiment the bus control master module 72 employs a 1 master to N slave configuration, with slaves being individually addressable and sharing a single TX/RX conductor pair. The bus control master module 72 may be mounted directly to the DIN rail and interfaces with the host PC over a serial or USB-to-serial cable 77.

A display 75 may be included to provide a visual indication of the state and other status of the relay.

Load power can be monitored through microcontroller 32 and used as a load fault detection means. A cycle counter may be included to report status or relay use and as a preventive maintenance to indicate whether the relay has cycled a predetermined amount of times so that it should be replaced. The cycle counter is capable of counting relay cycles, as well as storing the cycle information. Upon request, cycle counter data may be communicated through the UART 38 or other data communication port.

Indication off failure Internal diagnostics can report various problems, for example open coil or no load current when the relay is closed.

Contact resistance measurement can be made when the contacts are closed the current and voltage are measured and compared to predetermined range of acceptable contact resistance.

It should be understood that the application is not limited to the details or methodology set forth in the following description or illustrated in the figures. It should also be understood that the phraseology and terminology employed herein is for the purpose of description only and should not be regarded as limiting.

While the exemplary embodiments illustrated in the figures and described herein are presently preferred, it should be understood that these embodiments are offered by way of example only. Accordingly, the present application is not limited to a particular embodiment, but extends to various modifications that nevertheless fall within the scope of the appended claims. The order or sequence of any processes or method steps may be varied or re-sequenced according to alternative embodiments.

It is important to note that the construction and arrangement of the relay as shown in the various exemplary embodiments is illustrative only. Although only a few embodiments have been described in detail in this disclosure, those who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter recited in the claims. For example, elements shown as integrally formed may be constructed of multiple parts or elements, the position of elements may be reversed or otherwise varied, and the nature or number of discrete elements or positions may be altered or varied. Accordingly, all such modifications are intended to be included within the scope of the present application. The order or sequence of any process or method steps may be varied or re-sequenced according to alternative embodiments. In the claims, any means-plus-function clause is intended to cover the structures described herein as performing the recited function and not only structural equivalents but also equivalent structures. Other substitutions, modifications, changes and omissions may be made in the design, operating conditions and arrangement of the exemplary embodiments without departing from the scope of the present application.

The present application contemplates methods, systems and program products on any machine-readable media for accomplishing its operations. The embodiments of the present application may be implemented using an existing computer processors, or by a special purpose computer processor for an appropriate system, incorporated for this or another purpose or by a hardwired system. As noted above, embodiments within the scope of the present application include program products comprising machine-readable media for carrying or having machine-executable instructions or data structures stored thereon. This also includes any web applications which may be delivered from a web site and run within a web browser such as Adobe Flash® or Microsoft Silverlight®. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. When information is transferred or provided over a network or another communications connection (either hardwired, wireless, or a combination of hardwired or wireless) to a machine, the machine properly views the connection as a machine-readable medium. Thus, any such connection is properly termed a machine-readable medium. Combinations of the above are also included within the scope of machine-readable media. Machine-executable instructions comprise, for example, instructions and data which cause a general purpose computer, special purpose computer, or special purpose processing machines to perform a certain function or group of functions.

The invention claimed is:

1. A relay circuit comprising:
a power supply to apply an AC input line voltage to the relay circuit, a relay coil and at least one pair of contacts actuated by the relay coil;
a zero cross detection circuit; and
a control logic circuit;
wherein:
the control logic circuit is configured to determine a zero crossover point in response to an output signal from the zero crossover detection circuit; and
to control a relay coil to actuate the relay contacts to switch a load at the zero crossover point of a load current when the load is connected to the at least one pair of relay contacts, such that the voltage and current across the relay contacts is zero;
wherein the zero cross detection circuit comprises a plurality of resistors connected in series with a diode arrangement;
wherein an input signal to the zero cross detection circuit is applied to the plurality of resistors; and
wherein the diode arrangement comprises a pair of series connected diodes connected in reverse parallel with a third diode, and a Zener diode connected in parallel with the third diode.

2. The relay circuit of claim 1, wherein the power supply further provides a 5-volt DC power input to the control logic circuit.

3. The relay circuit of claim 1, wherein the zero cross detection circuit comprises a capacitor connected in parallel with the input voltage and the diode arrangement, and connected between two of the plurality of resistors, the capacitor configured to drain high frequency noise from input voltage.

4. The relay circuit of claim 1, wherein the control logic circuit comprises a microcontroller, the microcontroller programmable through a dual channel digital isolator receiving serial communications over a device serial port from a transmitter.

5. The relay circuit of claim 4, wherein the device serial port comprises a Universal Asynchronous Receiver/Transmitter.

6. The relay circuit of claim 1, wherein a current threshold and a temperature threshold are dynamically set in the control logic circuit.

7. The relay circuit of claim 1, further comprising a close and hold circuit to drive the relay coil, wherein a full drive current is applied to the relay coil to close the relay contacts, and then a reduced drive current is applied to the relay coil to maintain the relay contacts in an actuated state.

8. The relay circuit of claim 7, wherein the close and hold circuit further comprises a first transistor configured to actuate relay coil at full power, and a second transistor configured to maintain the relay coil in the actuated state.

9. The relay circuit of claim 4, wherein the microcontroller comprises an Analog to Digital converter to digitize the output signal from the zero crossover detection circuit.

10. The relay circuit of claim 1, wherein the relay contacts are controllable to open and close at the zero crossover point of a current waveform.

11. The relay circuit claim 1, wherein a phase controlled switching is automatically configured by a microcontroller to evaluate a load and to adjust a timing of the contact closure with respect to the zero crossover point of the AC input line voltage.

12. An electromechanical relay comprising:
an adaptive zero cross detection circuit in communication with a control logic circuit, a power supply for driving the control logic circuit; a current scaling and offset circuit; a relay coil and at least one pair of relay contacts controllable by the relay coil;
the control logic circuit comprising an A-D converter for outputting a control signal to the control logic circuit, and a close-and-hold drive circuit for operating the relay coil;
wherein a reference voltage is provided by the power supply to the current scaling and offset circuit; the current scaling and offset circuit arranged to drive the A/D converter; and the relay contacts associated with the relay coil controllable to switch a load such that a voltage and a current is zero across the at least one pair of relay contacts when switched;

wherein the zero cross detection circuit comprises a plurality of resistors connected in series with a diode arrangement, wherein an input signal to the zero cross detection circuit is applied to the plurality of resistors; and wherein the diode arrangement comprises a pair of series connected diodes connected in reverse parallel with a third diode, and a zener diode connected in parallel with the third diode.

13. The relay circuit of claim 12, wherein the zero cross detection circuit comprises a capacitor connected in parallel with the input voltage and the diode arrangement, and connected between two of the plurality of resistors, the capacitor configured to drain high frequency noise from input voltage.

* * * * *